(12) United States Patent
Yanase et al.

(10) Patent No.: US 8,939,348 B2
(45) Date of Patent: Jan. 27, 2015

(54) METAL BONDED STRUCTURE AND METAL BONDING METHOD

(71) Applicant: SANYO Electric Co., Ltd., Moriguchi (JP)

(72) Inventors: Yasuyuki Yanase, Hashima (JP); Koichi Saito, Ogaki (JP)

(73) Assignee: SANYO Electric Co., Ltd., Osaka (JP)

( * ) Notice: Subject to any disclaimer, the term of this patent is extended or adjusted under 35 U.S.C. 154(b) by 0 days.

(21) Appl. No.: 13/771,035

(22) Filed: Feb. 19, 2013

(65) Prior Publication Data

US 2013/0230740 A1     Sep. 5, 2013

Related U.S. Application Data

(63) Continuation of application No. PCT/JP2011/007044, filed on Dec. 16, 2011.

(30) Foreign Application Priority Data

Feb. 28, 2011  (JP) .................................. 2011-042408

(51) Int. Cl.
*B23K 31/02* (2006.01)
*B32B 7/04* (2006.01)
(Continued)

(52) U.S. Cl.
CPC . *B32B 7/04* (2013.01); *H01L 24/16* (2013.01); *H01L 24/81* (2013.01); *H01L 24/11* (2013.01); *H01L 24/13* (2013.01); *B23K 20/02* (2013.01); *B32B 15/01* (2013.01); *B23K 20/021* (2013.01); *H01L 2224/13147* (2013.01); *H01L 2224/8183* (2013.01); *H01L 2224/83191* (2013.01); *H01L 224/9211* (2013.01); *H01L 2924/01029* (2013.01); *H01L 2224/11825* (2013.01);
(Continued)

(58) Field of Classification Search
None
See application file for complete search history.

(56) References Cited

U.S. PATENT DOCUMENTS

| 5,439,164 A | 8/1995 | Hasegawa et al. |
| 5,551,626 A | 9/1996 | Hasegawa et al. |

(Continued)

FOREIGN PATENT DOCUMENTS

| EP | 576872 A1 | 1/1994 |
| JP | 6-262375 A | 9/1994 |

(Continued)

OTHER PUBLICATIONS

International Search Report issued in International Application No. PCT/JP2011/007044 dated Mar. 19, 2012.

*Primary Examiner* — Kiley Stoner
(74) *Attorney, Agent, or Firm* — McDermott Will & Emery LLP

(57) ABSTRACT

After a microcrystalline layer having a grain size that is finer than that of a base member is formed on the surface of at least one of a first bonding portion and a second bonding portion, the gap between the first bonding portion and the second bonding portion is filled with a solution into which copper oxide can be eluted, so as to deposit copper oxide contained in the surface oxide film into the solution. By applying pressure and by heating at a temperature of at most the copper recrystallization temperature, the components contained in the solution are removed except for copper, so as to elute copper oxide, thereby bonding the first bonding portion and the second bonding portion via the copper thus deposited. Subsequently, the copper is solid-phase diffused into the first bonding portion and the second bonding portion.

22 Claims, 9 Drawing Sheets

(51) Int. Cl.
*H01L 23/00* (2006.01)
*B23K 20/02* (2006.01)
*B32B 15/01* (2006.01)

(52) U.S. Cl.
CPC .............. *H01L24/32* (2013.01); *H01L 24/73* (2013.01); *H01L 24/83* (2013.01); *H01L 2224/0391* (2013.01); *H01L 2224/0401* (2013.01); *H01L 2224/05567* (2013.01); *H01L 2224/05624* (2013.01); *H01L 2224/1145* (2013.01); *H01L 2224/1146* (2013.01); *H01L 2224/1148* (2013.01); *H01L 2224/11903* (2013.01); *H01L 2224/13082* (2013.01); *H01L 2224/16237* (2013.01); *H01L 2224/2919* (2013.01); *H01L 2224/73104* (2013.01); *H01L 2224/81191* (2013.01); *H01L 2224/81447* (2013.01); *H01L 2224/11831* (2013.01); *H01L 2224/1184* (2013.01); *B23K 2203/12* (2013.01); *H01L 2924/00013* (2013.01)
USPC .................. 228/206; 228/254; 228/262.6

(56) References Cited

U.S. PATENT DOCUMENTS

| 2002/0185521 | A1* | 12/2002 | Kuriyama et al. | 228/194 |
| 2006/0273450 | A1* | 12/2006 | Shi et al. | 257/706 |
| 2010/0307642 | A1* | 12/2010 | Palumbo et al. | 148/518 |
| 2012/0160903 | A1* | 6/2012 | Saitou et al. | 228/206 |
| 2013/0175071 | A1* | 7/2013 | Shiba et al. | 174/126.2 |
| 2013/0206821 | A1* | 8/2013 | Saito et al. | 228/208 |
| 2013/0216302 | A1* | 8/2013 | Yanase et al. | 403/272 |

FOREIGN PATENT DOCUMENTS

| JP | 2003-100811 A | 4/2003 |
| JP | 2004-273230 A | 9/2004 |
| JP | 2006-334652 A | 12/2006 |
| JP | 2007-019360 A | 1/2007 |
| JP | 2007-083288 A | 4/2007 |
| JP | 2008-177378 A | 7/2008 |
| JP | 2010-277754 A | 12/2010 |
| WO | 2009060954 A1 | 5/2009 |
| WO | 2011/152423 A1 | 12/2011 |
| WO | WO 2011/152423 A1 * | 12/2011 |

\* cited by examiner

METAL BONDED STRUCTURE AND METAL BONDING METHOD

RELATED APPLICATIONS

This application is a Continuation of International Application No. PCT/JP2011/007044, filed on Dec. 16, 2011, which in turn claims the benefit of Japanese Application No. 2011-042408, filed on Feb. 28, 2011, the disclosures of which Applications are incorporated by reference herein.

BACKGROUND OF THE INVENTION

1. Field of the Invention

The present invention relates to a metal bonded structure and a metal bonding method. More specifically, the present invention relates to a copper-copper bonded structure and a copper-copper bonding method.

2. Description of the Related Art

As an electrically conductive material used to form a wiring layer that is a component of a wiring substrate, or used to form an electrode surface of each electrode of a semiconductor chip or the like, copper is widely employed. As a conventional metal bonding method for electrically connecting a first bonding member to be bonded such as a wiring layer of a wiring substrate or the like to a second bonding member to be bonded such as an element electrode of a semiconductor chip, examples of such a conventional metal bonding methods include: a method in which the bonding faces are solder-bonded via solder; a method in which the bonding faces are bonded to each other by applying pressure while heating the bonding faces at a high temperature; and a method in which the bonding faces are activated by means of ion irradiation or the like in a vacuum so as to bond the bonding faces to each other; and so forth.

[Related Art Documents]
[Patent Documents]
[Patent Document 1]
Japanese Patent Application Laid Open No. 2003-100811

With such a method in which a copper member is bonded to another copper member via solder, a Cu—Sn alloy layer occurs at a bonded interface between each copper layer and the adjacent solder layer. Such a Cu—Sn alloy layer has relatively large electric resistance, and poor ductility, leading to a problem of poor electrical characteristics and/or a problem of poor connection reliability at such a bonded portion. With such a method in which the bonding faces are bonded to each other by applying pressure while heating the bonding faces at a high temperature, in some cases, such an arrangement leads to a problem of damage of the wiring substrate or the semiconductor chip due to the application of heat or the application of pressure. With such a method in which the bonding faces are activated in a vacuum so as to bond the bonding faces to each other, such an arrangement requires large-scale equipment such as a vacuum apparatus, leading to an unavoidable increase in costs.

SUMMARY OF THE INVENTION

Means to Solve the Problem

An embodiment of the present invention relates to a metal bonded structure. The metal bonded structure is configured such that a first bonding portion formed of copper-based metal and a second bonding portion formed of copper-based metal are bonded to each other by diffusion bonding, and such that the metal bonded structure has a portion along a line that is orthogonal to a bonded interface between the first bonding portion and the second bonding portion, in which the number of copper grain boundaries per unit length is greater than that of the first bonding portion and that of the second bonding portion.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Description will be made below regarding an embodiment of the present invention with reference to the drawings. It should be noted that, in all the drawings, the same components are denoted by the same reference symbols, and redundant description will be omitted as appropriate. In the description below, "with Al as a principal component" and "with aluminum oxide as a principal component" mean that the material contains aluminum or aluminum oxide with a concentration that is greater than 50%.

Figure 1:
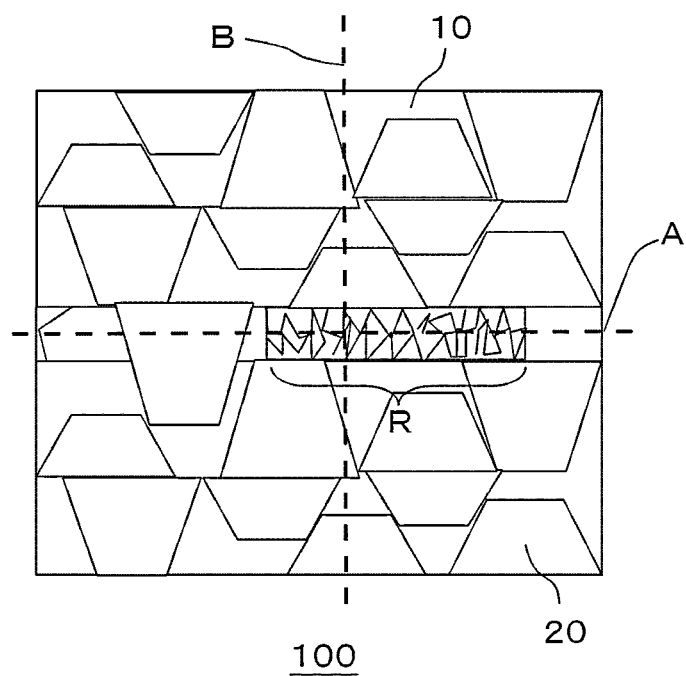
FIG. 1 is a schematic diagram showing a metal bonded structure according to an embodiment.

FIG. 1 is a schematic diagram showing a metal bonded structure according to the embodiment. A metal bonded structure 100 is a structure in which a first bonding portion 10 and a second bonding portion 20 are bonded to each other by means of diffusion bonding.

The first bonding portion 10 and the second bonding portion 20 are each formed of a copper-based metal material.

There is a region (region R shown in FIG. 1) in the vicinity of the bonded interface along the line B which is orthogonal to the bonded interface A between the first bonding portion 10 and the second bonding portion 20, in which the number of copper grain boundaries per unit length is greater than that in the first bonding portion 10 and that in the second bonding portion 20, which are each configured as a base member. The number of copper boundaries per unit length is inversely correlated with the copper grain size. Specifically, as the number of copper grain boundaries per unit length in a given region becomes greater, the copper grain size in this region becomes finer.

With the metal bonded structure 100 according to the present embodiment, such an arrangement provides a bonded portion formed of copper having a fine grain size, thereby providing bonding strength between the first bonding portion 10 and the second bonding portion 20.

Furthermore, by configuring the first bonding portion 10 and the second bonding portion 20 to each contain copper as a principal component, and by employing a structure in which the first bonding portion 10 and the second bonding portion 20 are bonded to each other via copper, such an arrangement suppresses the occurrence of a difference in thermal expansion rate between the respective components of the metal bonded structure 100. As a result, such an arrangement provides improved thermal reliability of the metal bonded structure 100.

[Metal Bonding Method]

Description will be made regarding a metal bonding method according to an embodiment with reference to FIGS. 2 through 4.

Figure 2A:
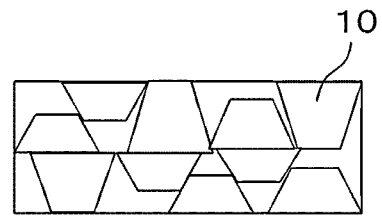
FIGS. 2A and 2B are process diagrams showing a metal bonding method according to an embodiment.
Figure 2A:
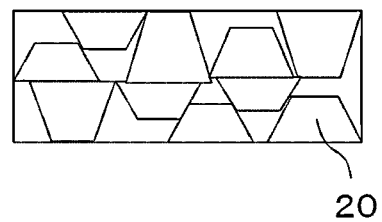

First, as shown in FIG. 2A, a first bonding portion 10 and a second bonding portion 20 are prepared. Provided that the first bonding portion 10 and the second bonding portion 20 are formed of copper-based metal, the forms of the first bonding portion 10 and the second bonding portion 20 are not restricted in particular. For example, the first bonding portion 10 and the second bonding portion 20 may each be configured as a copper sheet, or may each be configured as a copper deposited layer formed on a substrate such as a silicon substrate using a sputtering method or the like. Also, the first bonding portion 10 and the second bonding portion 20 may each be configured as an external terminal portion of a wiring layer formed by patterning a copper sheet such as a copper foil.

An oxide layer (not shown) with copper oxide as a principal component is formed on the bonding face side surface of the first bonding portion 10 and the bonding face side surface of the second bonding portion 20. The oxide layer is configured as a thin coating film formed of $Cu_2O$, and each have a thickness of 10 nm, for example. The oxide layer may be configured as an artificial coating film or a natural coating film. Examples of such a naturally-formed natural coating film include a natural oxide film which is formed by oxidation of copper in the atmosphere.

Figure 2B:
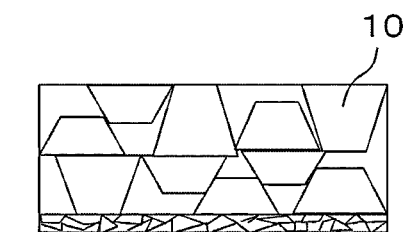
Figure 2B:
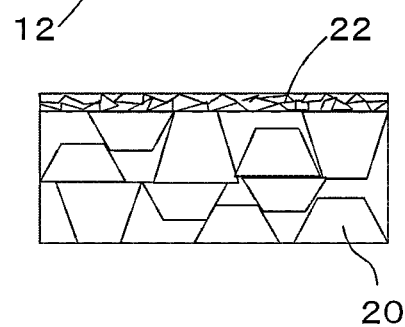

Next, as shown in FIG. 2B, a first microcrystalline layer 12 and a second microcrystalline layer 22 (which will be collectively referred to as the "microcrystalline layers" hereafter) are respectively formed on the bonding face side surfaces of the first bonding portion 10 and the second bonding portion (which will be collectively referred to as the "bonding portions" hereafter). The copper that forms the microcrystalline layer has a crystal grain size that is smaller than that of the copper that forms the bonding portion configured as a base member. Examples of a method for forming such a microcrystalline layer include: a method in which strain is applied to the bonding face side surface of the bonding portion so as to reduce the crystal grain size on the surface; a method in which a microcrystalline layer is deposited on the bonding face side surface of the bonding portion using a sputtering method, plating method, or the like. Such a sputtering method provides a microcrystalline layer having a finer grain size.

Figure 3A:
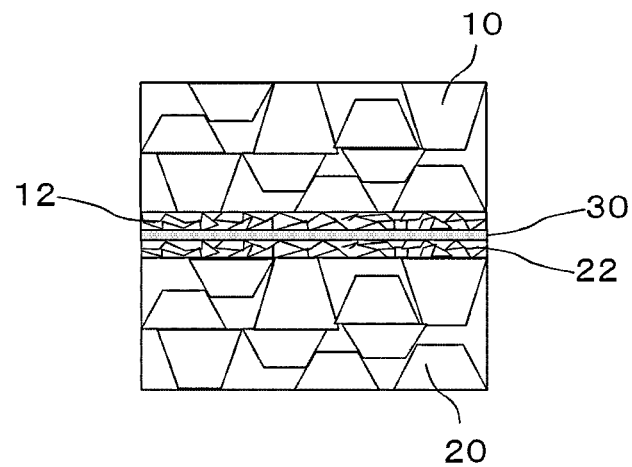
FIGS. 3A and 3B are process diagrams showing a metal bonding method according to an embodiment.

Next, as shown in FIG. 3A, the gap between the first microcrystalline layer 12 and the second microcrystalline layer 22 is filled with a solution 30 into which copper oxide can be eluted. In the stage in which the gap between the first microcrystalline layer 12 and the second microcrystalline layer 22 is filled with the solution 30, the distance between the exposed face of the first microcrystalline layer 12 and the exposed face of the second microcrystalline layer 22 is 1 μm, for example. The solution 30 is configured as a solution containing a ligand that can form a complex with copper. Examples of such a solution 30 include ammonia water, carboxylic acid aqueous solution, and so forth. The concentration of the solution 30 can be determined by experiment with respect to the pressure application conditions, the heat application conditions, or the like.

Examples of carboxylic acids used to prepare such a carboxylic acid aqueous solution include: monocarboxylic acid such as acetic acid, and the like; dicarboxylic acid such as oxalic acid, malonic acid, succinic acid, glutaric acid, phthalic acid, maleic acid, and the like; and oxycarboxylic acid such as tartaric acid, citric acid, lactic acid, salicylic acid, and the like.

With such an arrangement, such a carboxylic acid aqueous solution preferably contains carboxylic acid which is able to function as a multidentate ligand. With such a carboxylic acid aqueous solution containing carboxylic acid which is able to function as a multidentate ligand, the carboxylic acid and copper form a chelate, thereby generating a copper complex having markedly improved stability. As a result, such an arrangement is capable of reducing the temperature required for the bonding. It should be noted that the fact that tartaric acid forms a chelate is described in "The Iwanami Dictionary of Physics and Chemistry", 4th ed., p. 593 (Iwanami Shoten). Also, the fact that tartaric acid, oxalic acid, or the like, forms a chelate is described in "Inorganic chemistry", Vol. 2, p. 666, written by R. B. Heslop, K. Jones, translated by Yoshihiko Saito. Here, chelation represents a reaction in which a multidentate ligand forms a ring, thereby generating a complex having markedly improved stability. Description will be made below regarding an arrangement in which a citric acid aqueous solution is employed as the solution 30.

After the first bonding portion 10 and the second bonding portion 20 are left for a period of time on the order of 1 minute at room temperature, the copper oxide formed on the outermost face of the first microcrystalline layer 12 is eluted into the solution 30, thereby removing the copper oxide layer from the first microcrystalline layer 12. In addition, the copper oxide formed on the outermost face of the second microcrystalline layer 22 is eluted into the solution 30, thereby removing the copper oxide layer from the second microcrystalline layer 22. By eluting the copper oxide formed on the respective outermost faces (bonding face side exposed faces) of the first microcrystalline layer 12 and the second crystalline layer 22 into the solution 30, copper that forms the first microcrystalline layer 12 and copper that forms the second microcrystalline layer 22 are respectively exposed on the outermost face (bonding face side exposed face) of the first bonding portion 10 and the outermost face (bonding face side exposed face) of the second bonding portion 20. Furthermore, in the solution 30, a citric acid ion that functions as a ligand and a copper ion form a copper complex. With the present embodiment, such a copper complex is considered to be a thermally-degradable copper complex ion represented by $[Cu_2(C_6H_5O_7)_2]^{4-}$. It should be noted that citric acid is inactive with respect to copper. Thus, copper, which is a component of the first microcrystalline layer 12 and the second crystalline layer 22, does not react with the citric acid, and remains as a component of the respective layers, except for each outermost oxide layer.

Figure 3B:
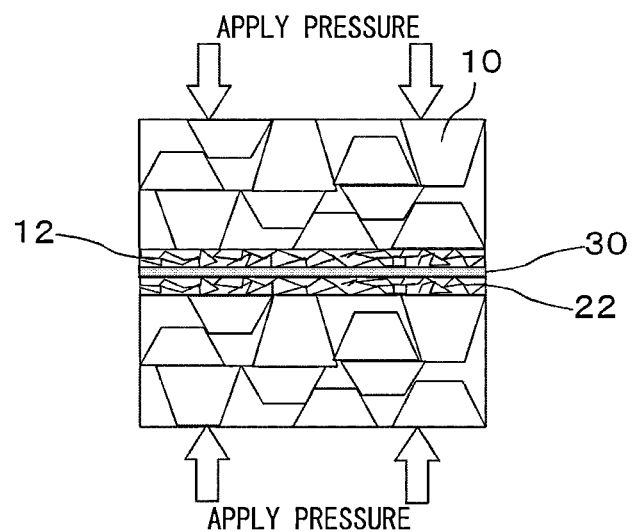

Next, as shown in FIG. 3B, pressure is applied to the first bonding portion 10 and the second bonding portion 20 by means of a press machine so as to reduce the distance between the first bonding portion 10 and the second bonding portion 20. In the pressing, a pressure of 1 to 30 MPa is applied, for example.

Figure 4A:
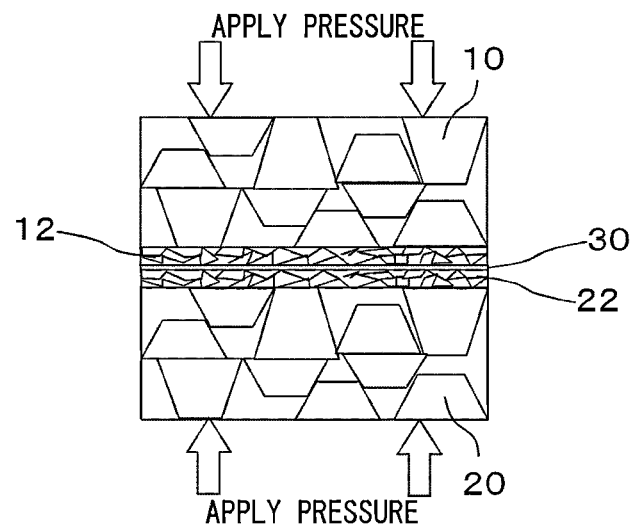
FIGS. 4A and 4B are process diagrams showing a metal bonding method according to an embodiment.

Next, as shown in FIG. 4A, by heating the first bonding portion 10 and the second bonding portion 20 at a temperature (e.g., 125° C. to 200° C.) that is equal to or lower than the copper recrystallization temperature while applying pressure to the first bonding portion 10 and the second bonding portion 20, the components contained in the solution 30 are removed except for copper, thereby depositing copper or otherwise providing partial recrystallization of copper. With the present embodiment, the heating provides evaporation of water. Furthermore, the heating provides thermal decomposition of the copper complex ion and the citric acid component. This gradually increases the concentration of copper contained in the solution 30. Furthermore, pressing by means of the press machine gradually reduces the distance between the outermost face of the first bonding portion 10 and the outermost face of the second bonding portion 20.

Figure 4B:
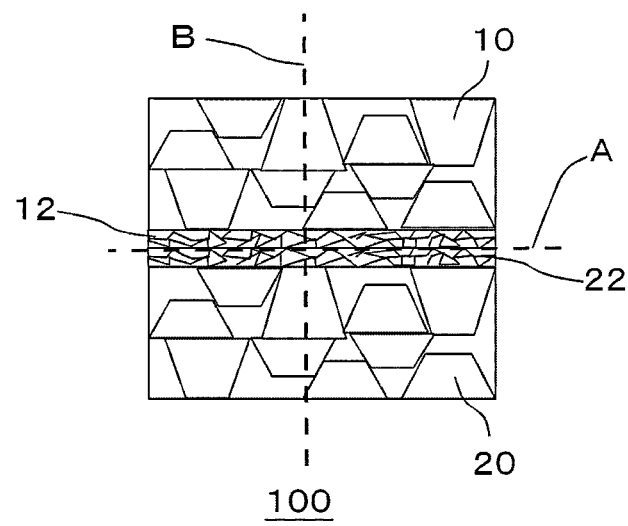

Next, as shown in FIG. 4B, after the completion of removal of components contained in the solution 30 except for the copper component, the outermost face of the first bonding portion 10 and the outermost face of the second bonding portion 20 are bonded to each other via deposited copper (not shown) by means of solid-phase diffusion of copper derived from the copper oxide. The deposited copper exhibits high orientation and high stability. In the final stage, the deposited copper has approximately the same thickness as the sum of the thickness of the copper oxide formed on the outermost face of the first microcrystalline layer 12 and the thickness of the copper oxide formed on the outermost face of the second microcrystalline layer 22. After the completion of bonding via the deposited copper by means of solid-phase diffusion, the heating is stopped, and the bonded portion provided by the deposited copper is gradually cooled until its temperature reaches on the order of room temperature. It should be noted that the period of time from the start of heating up to the stop of heating is 10 minutes, for example. After the cooling, the pressure application is stopped, whereby the bonding step for the first bonding portion 10 and the second bonding portion 20 is completed.

By executing the aforementioned steps, such an arrangement provides the metal bonded structure 100 having a region in the vicinity of the bonded interface along the line B which is orthogonal to the bonded interface A between the first bonding portion 10 and the second bonding portion 20, i.e., a region formed of the first microcrystalline layer 12, the second microcrystalline layer 22, and the deposited copper layer between the first microcrystalline layer 12 and the second microcrystalline layer 22, in which the number of copper grain boundaries per unit length is greater than that in the first bonding portion 10 and that in the second bonding portion 20, which are each configured as a base member.

With the metal bonded structure 100 shown in FIG. 4B, the first microcrystalline layer 12 and the second microcrystalline layer 22 are formed such that they extend along the bonded interface A. Thus, in a region along a given line B which is orthogonal to the bonded interface A, the number of copper grain boundaries per unit length is greater than that in the first bonding portion 10 and that in the second bonding portion 20, which are each configured as a base material. Furthermore, by adjusting the bonding conditions such as the bonding temperature, pressure, time, etc., such an arrangement is capable of encouraging partial recrystallization of the first microcrystalline layer 12 and the second microcrystalline layer 22 so as to rebuild such a microcrystalline layer into a copper crystal layer having the same copper grain size as that of the bonding portion. Thus, as shown in FIG. 1, such an arrangement provides a metal bonded structure 100 having a region that is located partially in the vicinity of the bonded interface between the first bonding portion 10 and the second bonding portion 20 along a line which is orthogonal to the bonded interface, in which the number of copper grain boundaries per unit length is greater than that in the first bonding portion 10 and that in the second bonding portion 20, which are each configured as a base member.

Description has been made above regarding a metal bonding method in which a microcrystalline layer is formed on each of the first bonding portion 10 and the second bonding portion 20. Also, such a microcrystalline layer may be formed on the first bonding portion 10 alone, or otherwise on the second bonding portion 20 alone. In this case, the microcrystalline layer is partially or otherwise entirely formed on the first bonding portion 10 side bonded interface or otherwise the second bonding portion 20 side bonded interface.

With the metal bonding method described above, such an arrangement is capable of bonding a pair of copper members at a relatively low temperature without involving large-scale equipment such as a vacuum apparatus or the like. Specifically, by eluting copper oxide formed on the outermost face of a microcrystalline layer into the solution 30, a copper layer is exposed as the outermost face of the bonding portion. In other words, the bonding face of the bonding portion is activated. After the bonding face of the bonding portion is activated, the first bonding portion 10 and the second bonding portion 20 are bonded to each other via the deposited copper 40. Thus, such an arrangement suppresses the occurrence of a void or byproduct between the bonded face of the first bonding portion 10 and the deposited copper 40, and between the bonded face of the second bonding portion 20 and the deposited copper 40, thereby providing improved reliability of the connection between the first bonding portion 10 and the second bonding portion 20.

Furthermore, with the present embodiment, by setting the bonding temperature to a temperature that is equal to or lower than the copper recrystallization temperature, such an arrangement provides a microcrystalline layer in the vicinity of the bonded interface between the bonding portions. Such a microcrystalline layer is capable of raising the strength of bonding between the bonding portions. As the grain size of the microcrystalline layer becomes finer, the bonding strength becomes greater. Thus, as a method for forming a microcrystalline layer having a finer grain size, a sputtering method is preferably employed.

Moreover, as such a deposited copper layer that functions as a bonded interface that bonds the first bonding portion 10 and the second bonding portion 20, such an arrangement uses copper derived from copper oxide that has been a component of the oxide coating film that coats the first microcrystalline layer 12 or the second microcrystalline layer 22. Thus, there is no need to prepare a bonding material as an additional material required to bond the first bonding portion 10 and the second bonding portion 20. Thus, such an arrangement is capable of reducing costs required to bond the first bonding portion 10 and the second bonding portion 20.

Example 1

For Example 1, a microcrystalline layer was formed by polishing the respective surfaces of a pair of copper plates each having a thickness of 1 mm. The gap between the copper plates arranged such that their respective microcrystalline layers faced each other was filled with a citric acid solution (having a concentration of 10%). Subsequently, the copper plates were bonded to each other under the bonding conditions of 200° C., 5.8 MPa, and 60 minutes. The tensile strength was measured for the bonded sample thus obtained. As a result, the bonded sample exhibited a maximum tensile strength of 48.3 MPa.

Figure 5:
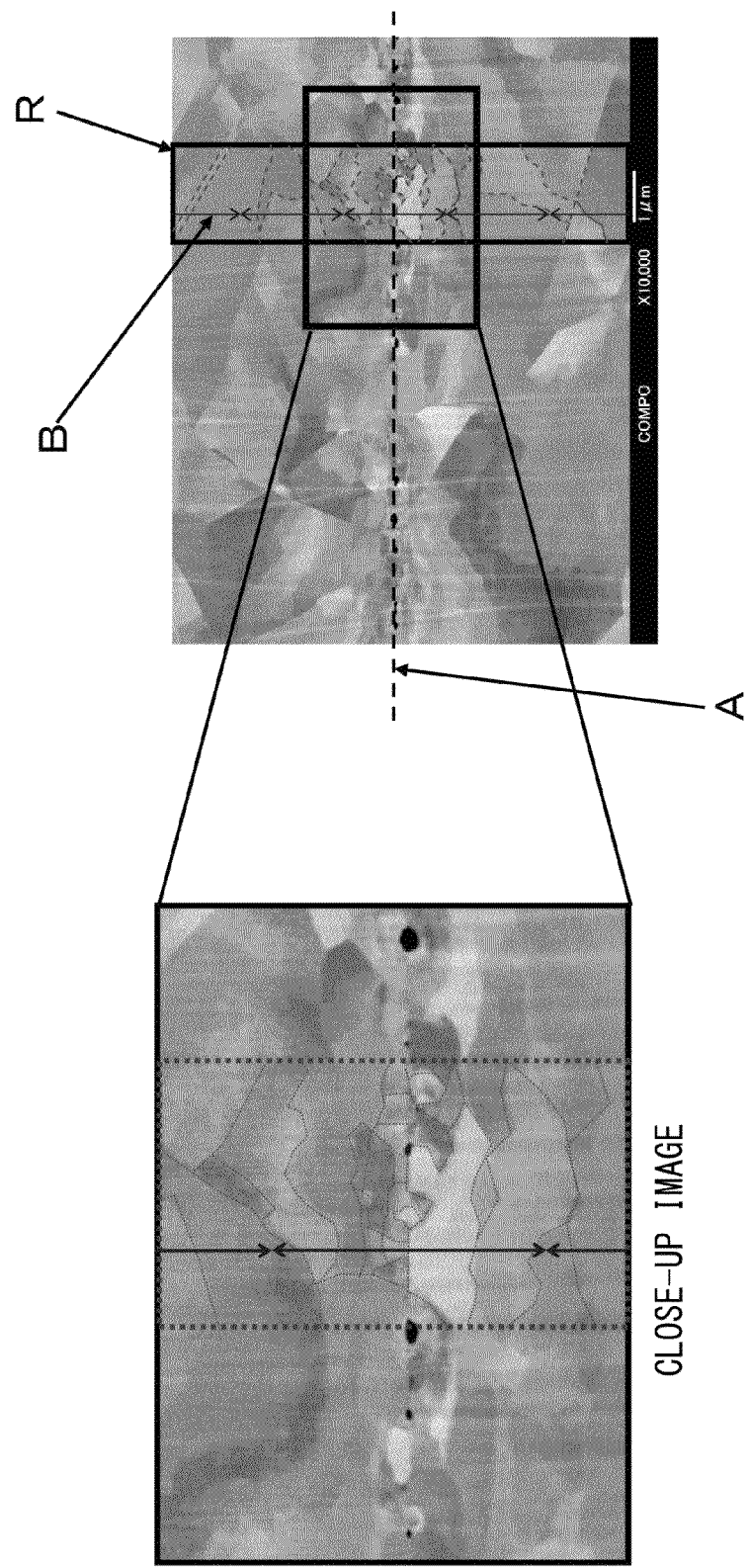
FIG. 5 shows cross-sectional SEM images of a bonded sample obtained in Example 1.
Figure 6:
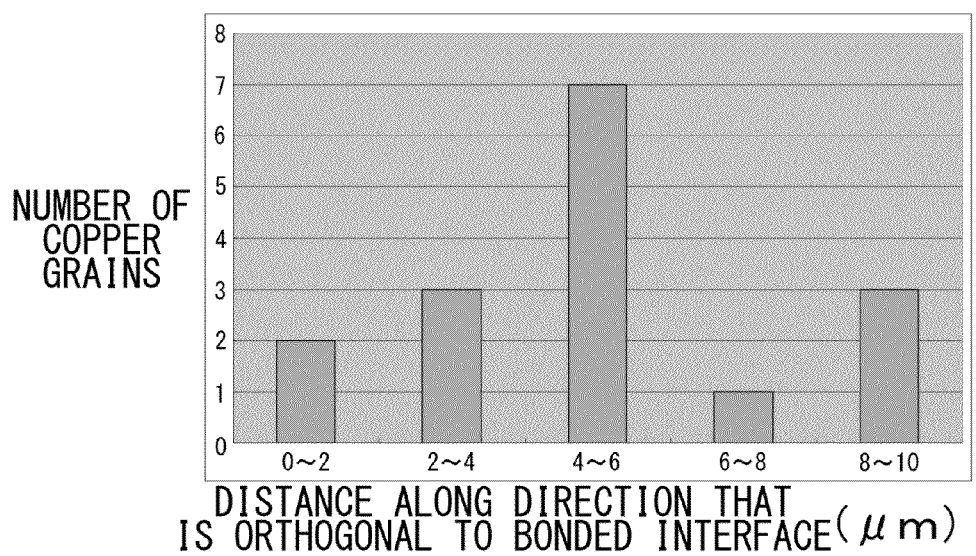
FIG. 6 is a graph showing the relation between the number of copper grain boundaries and the distance along the direction that is orthogonal to the bonded interface.

FIG. 5 shows cross-sectional SEM images of the bonded sample obtained in Example 1. In the right-hand image of the SEM images shown in FIG. 5, a dotted line is drawn along the copper grain boundaries in the rectangular region R including the bonded interface A. The number of copper grain boundaries is counted every 2 μm along the line B which is orthogonal to the bonded interface A. FIG. 6 shows the relation between the number of copper grain boundaries and the distance along the direction that is orthogonal to the bonded interface. The region at a distance of 4 to 6 μm along the direction that is orthogonal to the bonded interface corresponds to the region (in the vicinity of the bonded interface) including the bonded interface A shown in FIG. 5. As shown in FIG. 6, in the region in the vicinity of the bonded interface, the number of copper grain boundaries was markedly greater than that in other regions. Thus, it was confirmed that the aforementioned copper microcrystalline layer was formed in a region in the vicinity of the bonded interface.

Comparison Example 1

With Comparison example 1, such a microcrystalline layer was not formed. The gap between a pair of copper plates each having a thickness of 1 mm was filled with a citric acid solution (having a concentration of 10%). Subsequently, the copper plates were bonded to each other under the bonding conditions of 400° C., 5.8 MPa, and 60 minutes. The tensile strength was measured for the bonded sample thus obtained. As a result, the bonded sample exhibited a maximum tensile strength of 23.1 MPa.

Based upon the results of Example 1 and Comparison example 1, it has been confirmed that, by forming a microcrystalline layer on the surface of the bonding face side of a bonding portion, and by setting the bonding temperature to a temperature that is equal to or lower than the copper recrystallization temperature, such an arrangement provides improved bonding strength of the bonded sample thus obtained.

[Application Example of Metal Bonded Structure]

As an application example of the metal bonded structure and the metal bonding method described above, description will be made with reference to FIGS. 7 through 9 regarding an example in which the present invention is applied to a semiconductor device.

Figure 7A:
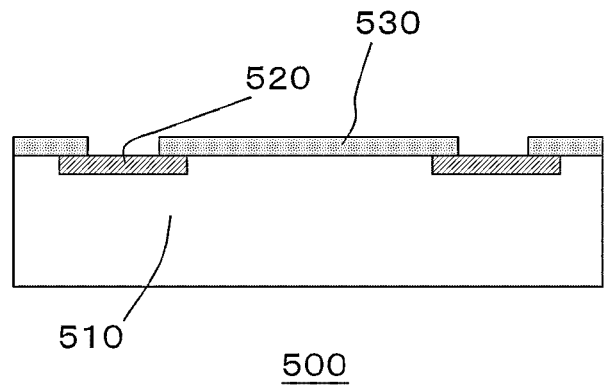
FIGS. 7A, 7B and 7C are process diagrams in a case in which the metal bonding method is applied to the manufacture of a semiconductor device.

First, as shown in FIG. 7A, a semiconductor chip 500 is prepared. The semiconductor chip 500 includes a semiconductor substrate 510, element electrodes 520, and an insulating resin layer 530. The semiconductor substrate 510 is configured as a silicon substrate, for example, on which is formed an integrated circuit (IC), a large-scale integrated circuit (LSI), etc. Each element electrode 520 can be formed by patterning an aluminum layer, for example. The insulating resin layer 530 is configured as a protective layer that coats the electrode formation face of the semiconductor substrate 510. Openings are formed in the insulating resin layer 530 such that each element electrode 520 is exposed. The insulating resin layer 530 is formed of polyimide, for example.

Figure 7B:
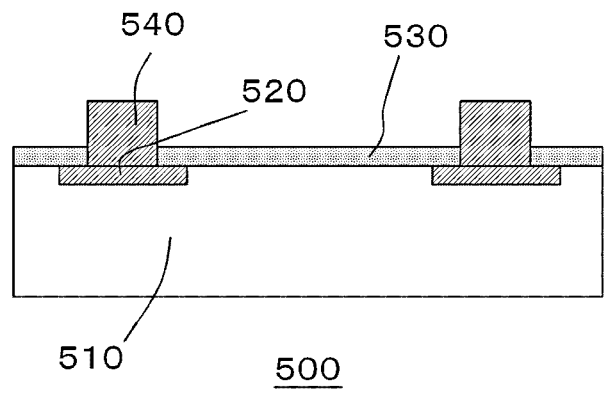

Next, as shown in FIG. 7B, a copper post 540 is formed on each element electrode 520 using a plating method, sputtering method, or the like. Such a copper post 540 is formed to have a height of 5 μm to 100 μm, for example.

Figure 7C:
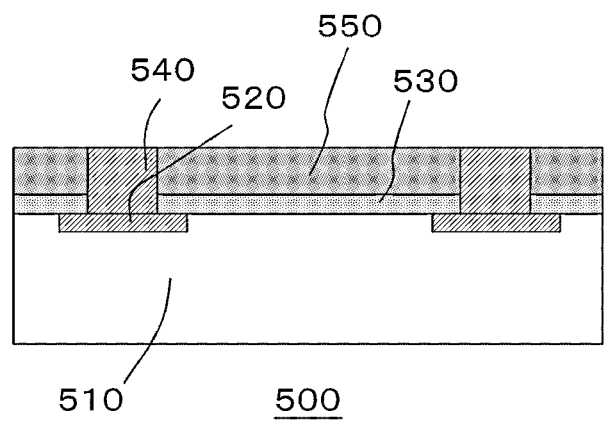

Next, as shown in FIG. 7C, an insulating resin layer 550 is formed on the insulating resin layer 530 such that the top face of each copper post 540 is exposed. Examples of such an insulating resin layer forming method in this step include: a method in which, in the lamination, such an insulating resin layer is formed to have a thickness which is adjusted beforehand; and a method in which, after such an insulating resin layer is formed with a thickness that is greater than the height of each copper post 540, the top face of each copper post 540 is exposed by means of $O_2$ plasma etching.

Figure 8A:
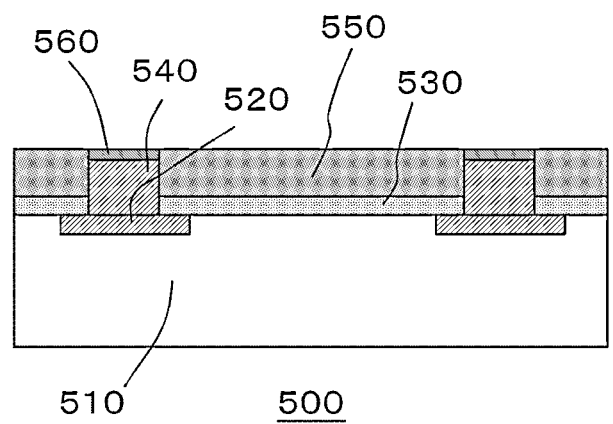
FIGS. 8A and 8B are process diagrams in a case in which the metal bonding method is applied to the manufacture of a semiconductor device.

Next, as shown in FIG. 8A, a microcrystalline layer 560 is formed on the top face of each copper post 540. The microcrystalline layer 560 can be formed using any one of the methods (polishing method, sputtering method, plating method, etc.) described in the aforementioned metal bonding method with reference to FIG. 2B.

Figure 8B:
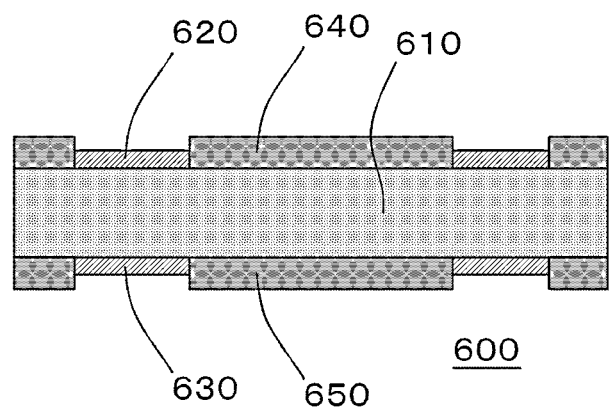

As shown in FIG. 8B, a wiring substrate 600 is prepared separately from the semiconductor chip 500. The wiring substrate 600 includes an insulating resin layer 610, substrate electrodes 620, substrate electrodes 630, an insulating resin layer 640, and an insulating resin layer 650.

Examples of a material that forms the insulating resin layer 610 include melamine derivative such as BT resin, etc., liquid crystal polymer, epoxy resin, PPE resin, polyimide resin, fluorine resin, phenolic resin, thermosetting resin such as polyamide bismaleimide, etc.

The substrate electrodes 620 are provided on one side of the insulating resin layer 610 (on the semiconductor element bonding face in the present embodiment), and are each formed of copper. The substrate electrodes 620 are electrically connected to a wiring layer (not shown) having a predetermined pattern provided on the aforementioned one side of the insulating resin layer 610. The substrate electrodes 630 are provided on the other side of the insulating resin layer 610, and are each formed of copper. The substrate electrodes 630 are electrically connected to a wiring layer (not shown) having a predetermined pattern provided on the other side of the insulating resin layer 610. Each substrate electrode 620 is electrically connected to the corresponding substrate electrode 630 through a via electrical conductor that passes through the insulating resin layer 610.

Figure 9A:
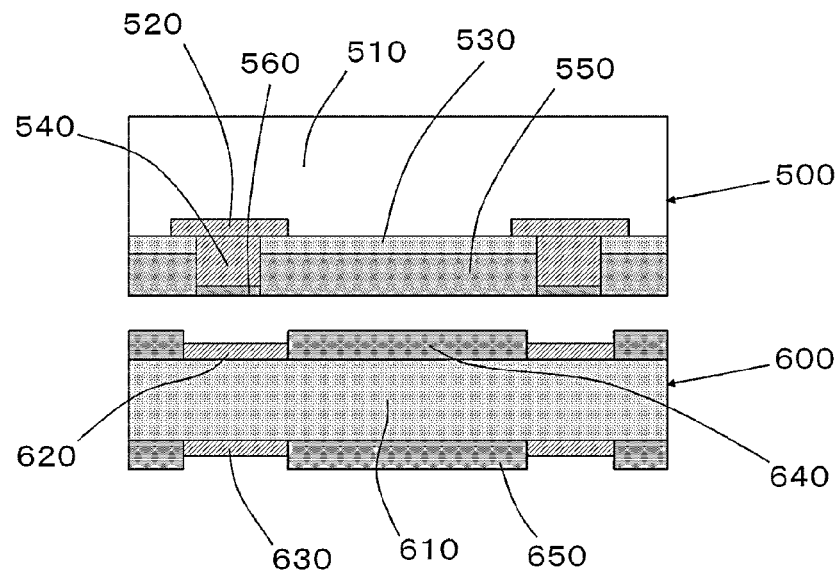
FIGS. 9A and 9B are process diagrams in a case in which the metal bonding method is applied to the manufacture of a semiconductor device.

Next, as shown in FIG. 9A, the wiring substrate 600 and the semiconductor chip 500 are aligned with each other such that each substrate electrode 620 provided to the wiring substrate 600 faces the corresponding copper post 540 provided to the semiconductor chip 500.

Figure 9B:
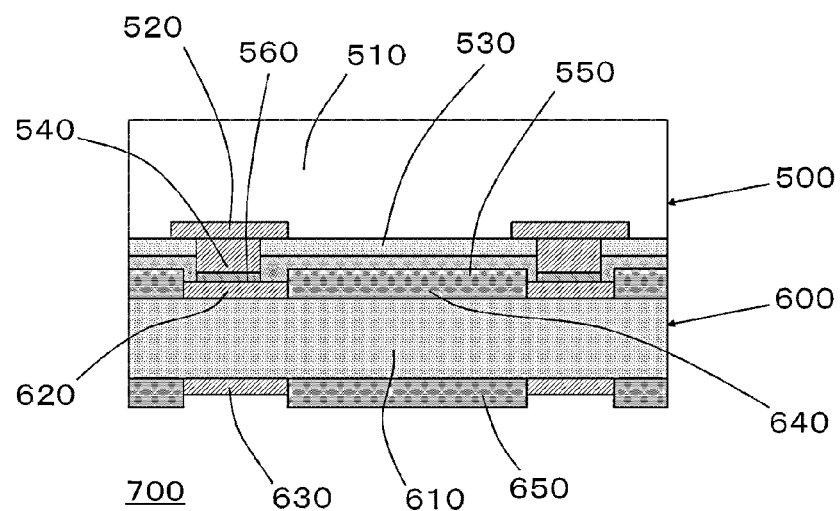

Next, by applying the bonding method described in the aforementioned metal bonding method with reference to FIGS. 3A through 4B, each substrate electrode 620 can be bonded to the corresponding copper post 540, as shown in FIG. 9B.

By executing the aforementioned steps, a semiconductor device 700 having the aforementioned metal bonded structure can be manufactured. By applying the aforementioned metal bonded structure to the semiconductor device 700, such an arrangement provides improved strength of the connection between each substrate electrode 620 and the corresponding copper post 540, thereby providing improved operation reliability of the semiconductor device.

It should be noted that the invention according to the present embodiment may be specified according to the items described below.

[Item 1] A metal bonded structure wherein a first bonding portion formed of copper-based metal and a second bonding portion formed of copper-based metal are bonded to each other by diffusion bonding, and wherein the metal bonded structure has a portion along a line that is orthogonal to a bonded interface between the first bonding portion and the second bonding portion, in which the number of copper grain boundaries per unit length is greater than that of the first bonding portion and that of the second bonding portion.

[Item 2] A metal bonding method comprising:

preparing a first bonding portion formed of copper-based metal and a second bonding portion formed of copper-based metal;

forming, on a surface of at least one from among the first bonding portion and the second bonding portion, a microcrystalline layer having a cooper grain size that is smaller than that of the bonding portion configured as a base member;

filling a gap between the first bonding portion and the second bonding portion with a solution into which an oxide with copper oxide as a principal component can be eluted;

applying pressure to the first bonding portion and the second bonding portion so as to reduce a distance between the first bonding portion and the second bonding portion; and applying heat at a temperature that is at most equal to a copper recrystallization temperature while applying pressure to the first bonding portion and the second bonding portion, so as to bond the first bonding portion and the second bonding portion to each other.

[Item 3] A metal bonding method according to Item 2, wherein the forming of the microcrystalline layer is configured as polishing, sputtering, or plating.

[Item 4] A metal bonding method according to Item 2 or 3, wherein the solution is inactive with respect to copper.

[Item 5] A metal bonding method according to any one of Items 2 through 4, wherein the solution contains a ligand that forms a complex with copper.

[Item 6] A metal bonding method according to Item 5, wherein the complex is thermally degradable.

[Item 7] A metal bonding method according to any one of Items 2 through 6, wherein the solution is configured as ammonia water, or otherwise as a carboxylic acid aqueous solution.

What is claimed is:

1. A metal bonding method for bonding a first metal and a second metal each including copper as a principal component, the method comprising:
    forming a layer on at least one of the first metal and the second metal, the layer including copper as a principal component and having a copper crystal grain size smaller than that of the first metal and the second metal;
    after the layer is formed, filling a gap between the first metal and the second metal with a solution into which oxide including a copper oxide is eluted;
    pressing the first metal and the second metal against each other to reduce the gap after the gap is filled with the solution; and
    applying heat to the gap to a temperature equal to or lower than a copper recrystallization temperature, with the first metal and the second metal pressed against each other.

2. The metal bonding method according to claim 1, wherein the layer forming step includes polishing a surface of the at least one of the first metal and the second metal to form the layer on the surface.

3. The metal bonding method according to claim 1, wherein the solution is inactive with respect to copper.

4. The metal bonding method according to claim 2, wherein the solution is inactive with respect to copper.

5. The metal bonding method according to claim 1, wherein the solution contains a ligand that forms a complex with copper.

6. The metal bonding method according to claim 2, wherein the solution contains a ligand that forms a complex with copper.

7. The metal bonding method according to claim 3, wherein the solution contains a ligand that forms a complex with copper.

8. The metal bonding method according to claim 5, wherein the complex is thermally degradable.

9. The metal bonding method according to claim 6, wherein the complex is thermally degradable.

10. The metal bonding method according to claim 7, wherein the complex is thermally degradable.

11. The metal bonding method according to claim 1, wherein the solution is ammonia water or a carboxylic acid aqueous solution.

12. The metal bonding method according to claim 2, wherein the solution is configured as ammonia water, or otherwise as a carboxylic acid aqueous solution.

13. The metal bonding method according to claim 3, wherein the solution is ammonia water or a carboxylic acid aqueous solution.

14. The metal bonding method according to claim 4, wherein the solution is ammonia water, or a carboxylic acid aqueous solution.

15. The metal bonding method according to claim 5, wherein the solution is ammonia water or a carboxylic acid aqueous solution.

16. The metal bonding method according to claim 6, wherein the solution is ammonia water, or a carboxylic acid aqueous solution.

17. The metal bonding method according to claim 7, wherein the solution is ammonia water or a carboxylic acid aqueous solution.

18. The metal bonding method according to claim 8, wherein the solution is ammonia water or a carboxylic acid aqueous solution.

19. The metal bonding method according to claim 9, wherein the solution is ammonia water or a carboxylic acid aqueous solution.

20. The metal bonding method according to claim 1, wherein the layer forming step including performing sputtering to form the layer on the at least one of the first metal and the second metal.

21. The metal bonding method according to claim 1, wherein the layer forming step includes performing plating to form the layer on the at least one of the first metal and the second metal.

22. The metal bonding method according to claim 1, wherein the layer forming step includes applying strain to a surface of the at least one of the first metal and the second metal to form the layer.

* * * * *